US007643602B2

(12) United States Patent
Miller et al.

(10) Patent No.: US 7,643,602 B2
(45) Date of Patent: Jan. 5, 2010

(54) METHOD AND SYSTEM FOR ESTIMATING FREQUENCY OFFSETS

(75) Inventors: Timothy R. Miller, Arlington, VA (US); John W. McCorkle, Vienna, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 628 days.

(21) Appl. No.: 11/239,350

(22) Filed: Sep. 30, 2005

(65) Prior Publication Data

US 2007/0076822 A1  Apr. 5, 2007

(51) Int. Cl.
*H03D 3/24* (2006.01)

(52) U.S. Cl. ............... 375/376; 375/373; 375/371; 375/354; 327/141; 327/144; 327/145; 327/147; 327/156; 370/503; 709/248; 713/375; 714/12

(58) Field of Classification Search ............... None
See application file for complete search history.

(56) References Cited

U.S. PATENT DOCUMENTS

| | | | | |
|---|---|---|---|---|
| 3,764,917 | A * | 10/1973 | Rhee ............... | 455/208 |
| 4,349,489 | A * | 9/1982 | Gaget et al. ............... | 261/41.5 |
| 4,542,514 | A * | 9/1985 | Watanabe ............... | 375/226 |
| 4,849,993 | A * | 7/1989 | Johnson et al. ............... | 375/357 |
| 5,247,543 | A * | 9/1993 | Tsuda et al. ............... | 375/325 |
| 5,619,543 | A * | 4/1997 | Glass ............... | 375/376 |
| 5,737,694 | A * | 4/1998 | McMahill et al. ............... | 455/76 |
| 6,046,645 | A * | 4/2000 | Cucchi et al. ............... | 331/1 R |
| 6,359,944 | B1 * | 3/2002 | Curtis et al. ............... | 375/344 |
| 6,697,445 | B1 * | 2/2004 | Wong ............... | 375/376 |
| 6,741,665 | B2 * | 5/2004 | Kenney et al. ............... | 375/344 |
| 7,023,267 | B2 * | 4/2006 | Lee et al. ............... | 330/10 |
| 7,203,457 | B1 * | 4/2007 | Wetzel ............... | 455/3.02 |
| 7,212,512 | B2 * | 5/2007 | Lucas et al. ............... | 370/338 |
| 2004/0041636 | A1 * | 3/2004 | Ballantyne ............... | 331/2 |
| 2004/0070431 | A1 * | 4/2004 | Henrickson ............... | 327/149 |
| 2004/0071249 | A1 * | 4/2004 | Schell ............... | 375/371 |
| 2006/0115032 | A1 * | 6/2006 | McCorkle et al. ............... | 375/354 |
| 2007/0035345 | A1 * | 2/2007 | Siddall ............... | 331/16 |
| 2007/0140386 | A1 * | 6/2007 | Howard ............... | 375/344 |
| 2008/0240292 | A1 * | 10/2008 | Miller ............... | 375/316 |

\* cited by examiner

*Primary Examiner*—Shuwang Liu
*Assistant Examiner*—Gina McKie

(57) ABSTRACT

A method is provided for estimating a frequency offset value. This method includes: receiving a signal from the transmitting device at the receiving device, the received signal having a transmitter frequency (510); generating a local signal at the receiving device, the local signal having a starting frequency (520); comparing a received signal phase and a local signal phase to determine an adjusted error signal representing a phase difference between the received signal and the local signal (530); adjusting a current frequency of the local signal from the starting frequency to the transmitting frequency over a time period (540); integrating the adjusted error signal over the time period to generate an integrated error signal (550); and filtering the integrated error signal to generate a frequency difference estimate indicative of the frequency difference between the transmitter frequency and the starting frequency (560).

11 Claims, 5 Drawing Sheets

METHOD AND SYSTEM FOR ESTIMATING FREQUENCY OFFSETS

FIELD OF THE INVENTION

The present invention relates in general to wired or wireless networks in which different devices in the network operate using different clocks and need to synchronize these clocks to properly pass signals between the devices.

BACKGROUND OF THE INVENTION

In a typical wired or wireless network each device in the network will have its own clock to regulate the signals it transmits or receives. And in many networks a clock in a given device will operate independently of the clocks in each of the other devices, meaning that the phase of any given clock will be effectively random with respect to the phase of any other clock in-the network. In such a network it may be necessary, therefore, for a receiver to synchronize its clock with the clock of a transmitter before it can properly process data received from the transmitter. This process of phase synchronization is typically referred to as signal acquisition.

Ideally, each compatible device will have the same clock frequency, meaning that once the phase of the receiver clock is synchronized to the phase of the transmitter clock in an acquisition process, the receiver clock should be able to stay at this acquired phase for the remainder of the transmitted signal. However, this is generally not the case.

Although two compatible devices will ostensibly have the same clock frequency, the physical realities of circuit design will result in slight differences in clock frequencies. For example, clock crystals used for timing have a frequency tolerance in terms of parts per million (PPM) of their frequency. For example, a 10 MHz clock with a tolerance of ±100 PPM would actually have a clock frequency that was between 9.999 MHz and 10.001 MHz, or a possible difference of ±1 kHz. As a result, even though each device in a network may have the same model of clock crystal, these slight variations in the individual clock crystals may give each device a slightly different clock frequency.

And since a difference in frequency represents a systematical change in phase, if the transmitter clock and the receiver clock have slightly different frequencies, their clock phases will constantly drift apart, even once they are synchronized. As a result, many systems also employ a tracking process whereby after acquisition is complete, a receiver will monitor the phase of an incoming signal and periodically adjust the phase of the receiver clock to maintain its synchronization with the transmitter clock.

Of course, the greater the separation between the frequencies of the transmitter clock and the receiver clock, the more difficult this tracking process will be. Large frequency differences may increase the number of lost connections that occur when the tracking process fails and the phase of the receiver clock slips too far from the phase of the transmitter clock. Also, the receiver has implementation-dependent limitations that cap the size of the frequency difference that is tolerable. As frequency offsets approach this limit, noisy data will have a more pronounced impact on system performance. Data that would have been successfully detected with smaller frequency offsets will fail detection at larger offsets.

The tracking process would be simplified if the receiver had some information as to what the frequency difference (sometimes called the frequency offset or the frequency difference) was between the transmitter clock and the receiver clock. This information would allow the receiver to predict how the phase difference between the received signal and the local signal would change over time. And such predictability in phase change would provide for a larger allowable frequency difference between the transmitter clock and the receiver clock, while retaining the same level of system performance.

A larger allowable frequency difference between a transmitter and a receiver would allow devices to use clock crystals with a larger frequency tolerance. And since frequency tolerance and price are linked (the smaller the tolerance, the higher the price), this would allow the devices to use cheaper clock crystals, thus reducing device cost. As a result, it would be desirable to provide a method or circuit that would provide an estimate of the frequency difference between an incoming signal received from a transmitting device and a local signal generated by a receiving device.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

Figure 1:
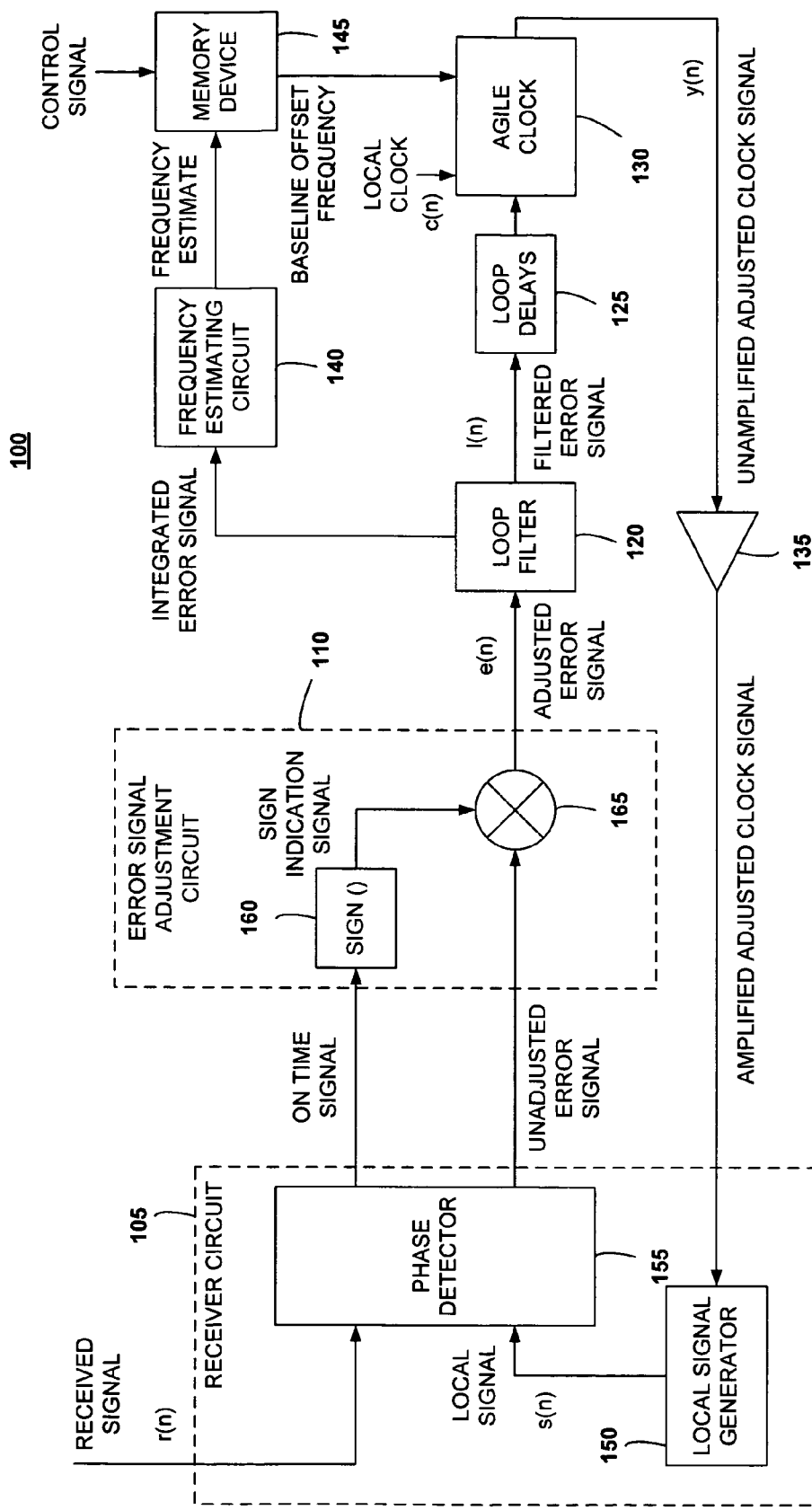
FIG. 1 is a block diagram of a tracking control loop from a disclosed embodiment of the present invention.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore or application specific ICs.

It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

The circuits and methods described below are applicable to any wired or wireless network in which a transmitter and a receiver operate using different clocks, which may vary in phase or frequency. One particular type of wireless network in which the methods and circuits are particularly applicable is ultrawide bandwidth (UWB) networks. However, they should not be limited to UWB networks.

Frequency Difference Estimating Circuit

As noted above, it is desirable to determine an estimate of the frequency difference between a clock in a transmitting device and a clock in a receiving device. This allows the receiving device to program its clock frequency to mimic that of the transmitter, thus improving the tracking process and allowing a greater frequency difference between the clocks of the two devices, while retaining a desired level of performance. All future communications between the two devices will benefit from the resulting smaller frequency offset.

A device that performs a tracking function will generally have a tracking control loop to perform this tracking function. The tracking control loop will process an incoming signal and a local signal after synchronization (i.e., acquisition) has taken place. It will determine the phase difference between the received signal and the local signal, and will provide a feedback signal to adjust the phase of the local signal to keep it synchronized with that of the received signal.

FIG. 1 is a block diagram of a tracking control loop from a disclosed embodiment of the present invention. As shown in FIG. 1, the tracking control loop 100 includes a receiver circuit 105, an error signal adjustment circuit 110, a loop filter 120, a loop delay element 125, an agile clock 130, a feedback amplifier 135, and a frequency estimating circuit 140, and a memory device 145. The receiver circuit 105 in this embodiment further includes a local signal generator 150 and a phase detector 155. The error signal adjustment circuit 110 in this embodiment further includes a sign detector 160 and a multiplier 165.

The receiver circuit 105 accepts the received signal r(n) and generates an on-time signal, representing the demodulated received signal, and an unadjusted error signal, representing the phase difference between a clock in the transmitter and a clock in the receiver. One way to implement this is by using a local signal generator 150 and a phase detector 155.

The local signal generator 150 generates a local signal s(n) that has a phase and frequency based on an adjusted clock signal y(n) from the agile clock 130, that is derived from a local clock signal c(n), as modified according to the operation of the tracking control loop 100. This local signal s(n) generally has known properties with respect to portions of the received signal (e.g., it may have a known signal shape for a given time period that matches a received signal shape in the received signal for a similar time period).

The received signal r(n) and the local clock c(n) have a native frequency and phase difference $\phi_T(n)$ between them equal to:

$$\phi_T(n) = \phi_0 + n \cdot \Delta\phi, \quad (1)$$

where $\phi_0$ is a constant phase difference that represents a phase offset between the received signal and the local clock, and $\Delta\phi$ is a ramping phase difference that represents the constantly-changing phase between the received signal and the local clock, and n is a digital sample index representing the sample time for the current phase difference from a set starting time.

The ramping phase difference $\Delta\phi$ can also be called the angular frequency, since a regularly-changing phase is the same as a frequency. Thus, the ramping phase difference $\Delta\phi$ is directly related to the frequency difference between the received signal and the local signal, and can be used to represent that frequency difference.

The phase detector 155 accepts the received signal r(n) and the local signal s(n), and generates an on-time signal, representing the received signal, and an unadjusted error signal, representing the phase difference between the received signal r(n) and the local signal s(n) (which unadjusted error signal also represents a phase difference between a transmitter clock and a receiver clock.). Particular circuits for performing the function of the phase detector 155 are well known in the art.

The unadjusted error signal output by the receiver circuit 105 shows the current phase difference (i.e., a phase error) between the received signal r(n) and the local signal s(n) at any given sample time n.

The error signal adjustment circuit 110 receives the on-time signal and the unadjusted error signal from the receiver circuit 105 and adjusts the unadjusted error signal so that its value does not vary according to the polarity of the on-time signal. The polarity of the on-time signal may change depending upon the modulation technique employed. For bipolar modulation, the signal will have one pattern for a digital "0" and an inverted pattern for a digital "1." As a result, the unadjusted error signal will have its polarity flip depending upon the digital value currently carried on the on-time signal. For other modulation schemes (e.g., ternary, or other M-ary modulation) corresponding polarity changes may occur.

The adjusted error signal is set to have its polarity remain the same regardless of the bit value or values carried on the on-time signal. This allows the remainder of the tracking control loop 100 to receive an indicator of the phase error so that it can determine the proper feedback signal to reduce the phase error to zero.

In the embodiment of FIG. 1, the sign detector 160 receives the on-time signal from the receiver circuit 105 and determines its sign (i.e., whether it is positive or negative), and outputs a sign indication signal that indicates the sign of the on-time signal. For example, the sign indication signal might have a positive value if the on-time signal were positive, and might have a negative value if the on-time signal were negative.

The multiplier 165 then multiplies the unadjusted error signal by the sign indication signal to produce and adjusted error signal e(n). This adjusted error signal e(n) has the same value regardless of the data value in the received signal r(n).

In alternate embodiments the error signal adjustment circuit 110 can be implemented in different ways. For example, lead and lag terms can be computed by delaying and advancing a local oscillator relative to the phase of the local oscillator used to compute the on-time signal. The difference between the absolute values of the lead and lag terms will produce an adjusted error signal.

The loop filter 120 is provided to give the tracking control loop its desired performance. In particular, the type of loop filter 120 used and the parameters for the loop filter 120 are chosen to generate a filtered error signal that will produce feedback that will drive any phase errors or frequency differences between the received signal and the local clock that fall within the tracking range of the circuit to zero.

The loop delay element 125 represents the variety of delays that will be contained in the tracking control loop 100. As such it is not a single element, but rather reflects a number of elements in the tracking control loop 100 that delay signals passing through or otherwise limit their bandwidth. Since the loop delay element 125 may represent multiple individual elements, it also need not be located between the loop filter 120 and the agile clock 130, but can be anywhere in the tracking control loop 100.

The agile clock 130 provides an unamplified feedback signal in response to the filtered error signal (delayed by any loop delays present in the loop delay element 125). This unamplified feedback signal is amplified by the feedback amplifier 135 as an amplified feedback signal, and is provided to the receiver circuit 105 to adjust the phase of the local signal s(n) to match that of the received signal r(n).

In operation, the agile clock begins operation at a frequency determined by the local clock c(n) and a baseline offset frequency that represents an estimate of the offset between the clock in the transmitter and the local clock c(n).

In various embodiments the agile clock 130 can be implemented through the use of a digital data storage (DDS) read-only memory (ROM), and a digital-to-analog converter (DAC). In other embodiments the agile clock could be a voltage-controlled oscillator. In some embodiments the feedback amplifier 135 can be eliminated and the output of the agile clock 130 can be provided directly to the receiver circuit 105.

The frequency estimating circuit 140 uses an integrated error signal from the loop filter 120 to provide an estimate $\Delta\hat{\phi}$ of the angular frequency between the received signal and the local signal at a starting frequency (i.e., between the transmitter clock and the receiver clock, as adjusted by the baseline offset frequency). This can be as simple as sending the integrated error signal from the loop filter 120 through a properly-designed filter, or more complicated signal processing. And although $\Delta\hat{\phi}$ is an estimate of the angular frequency (i.e., the ramping phase), it is proportional to the frequency offset by a known amount and can therefore be used as an indicator of the actual frequency offset between the transmitter and the receiver.

The memory device 145 uses the frequency estimate provided by the frequency estimating circuit 140 to store an estimate for the frequency offset between the clock in the transmitter and the clock in the receiver. This frequency offset will be stored in the memory device 145 along with an identifier for the current transmitting device (e.g., a MAC address for the transmitting device). The memory device 145 can be a random access memory (RAM), a group of registers, or any suitable memory element.

The memory device 145 can provide a stored frequency offset value for a given transmitter to the agile clock 130 as a baseline offset frequency in response to a control signal from a circuit controller (not shown). Typically a media access controller (MAC) manages the different devices joining and leaving a network. As a result, the MAC would manage the associations between devices in the network, and could ultimately be responsible for generating an appropriate control signal to the memory device 145.

Although the receiver circuit 105 of FIG. 1 is shown as using the received signal r(n) to generate the on-time and unadjusted error signals, alternate embodiments could use any signal whose phase and frequency was proportional to the received signal r(n). For example, the receiver circuit 105 could process a signal that was derived from the received signal r(n).

Figure 2:
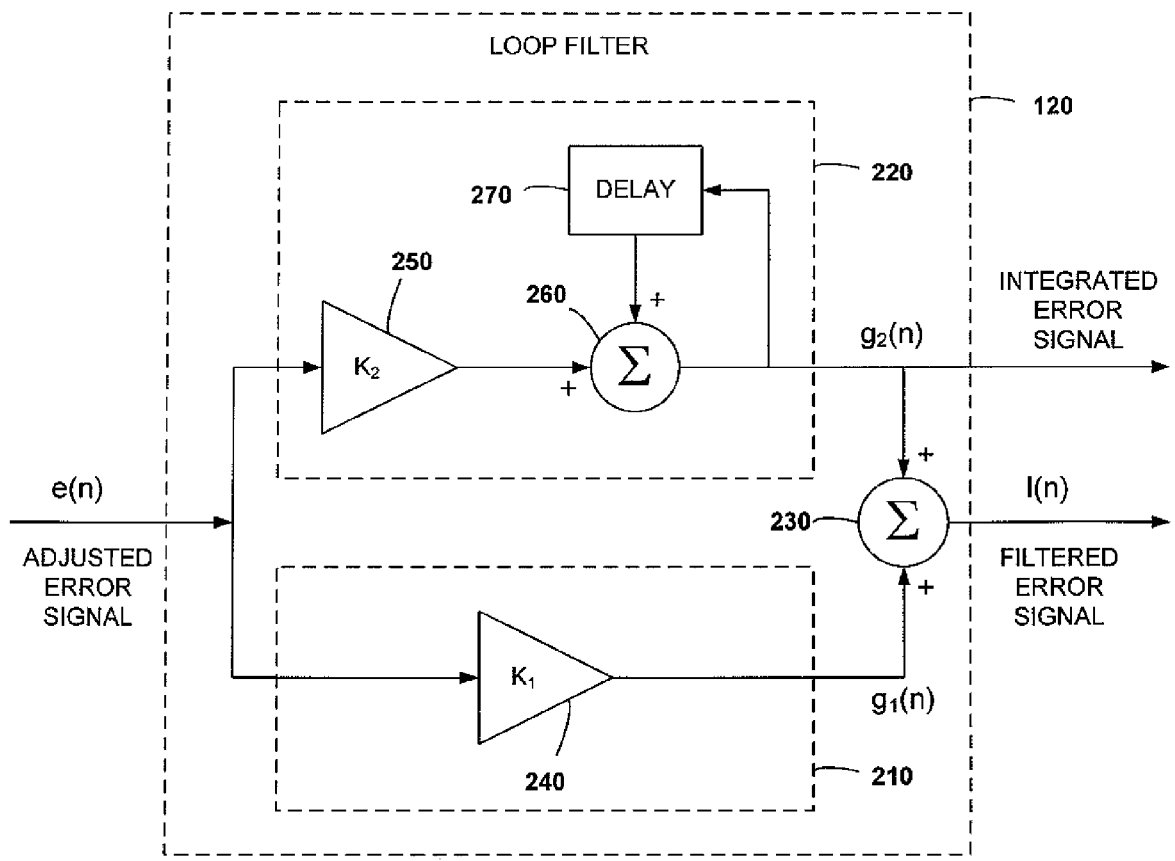
FIG. 2 is a block diagram of a loop filter of FIG. 1, according to a disclosed embodiment of the present invention.

FIG. 2 is a block diagram of a loop filter of FIG. 1, according to a disclosed embodiment of the present invention. As shown in FIG. 2, the loop filter 120 includes a proportional path 210, an integral path 220, and a first summer 230. The proportional path 210 further includes a first amplifier 240; and the integral path 220 includes a second amplifier 250, a second summer 260, and a delay element 270.

The first amplifier 240 in the proportional path 210 amplifies the error signal e(n) by a first gain $K_1$, to form a proportional path signal $g_1(n)$.

The second amplifier 250 in the integral path 220 amplifies the error signal e(n) by a second gain $K_2$. This amplified signal is then sent to the second summer 260 and the delay element 270, which integrate the result to form an integral path signal $g_2(n)$. This integral path signal $g_2(n)$ corresponds to the integrated error signal of FIG. 1.

The first summer 230 then adds the proportional path signal $g_1(n)$ and the integral path signal $g_2(n)$ together to form the filtered error signal l(n).

As will be shown below, the integral path signal $g_2(n)$ generated within the loop filter 120 can be used to generate an estimate $\Delta\hat{\phi}$ of the frequency difference between the received signal and the local signal.

Modeling of the Tracking Control Loop

Figure 3:
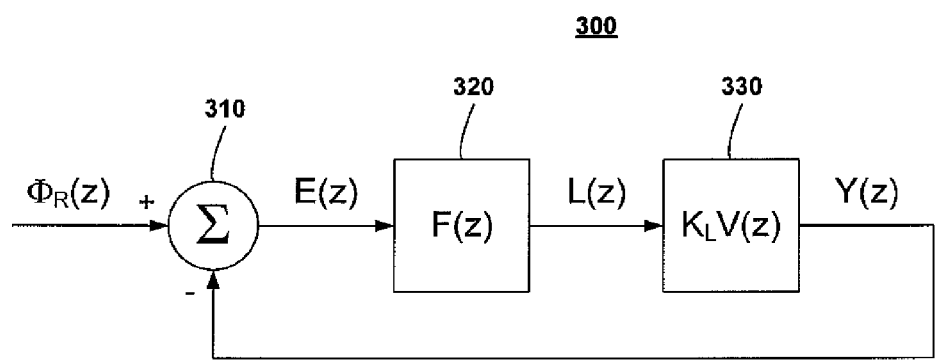
FIG. 3 is a diagram of the tracking control loop of FIG. 1, according to a disclosed embodiment of the present invention.

For purposes of signal processing, the circuit of FIG. 1 can be modeled as a simple function. FIG. 3 is a diagram of the tracking control loop 100 of FIG. 1, according to a disclosed embodiment of the present invention. The tracking control loop 300 of FIG. 3 is represented in the frequency domain by performing a z-transform on each of the signals and impulse responses. As shown in FIG. 3, the tracking loop 300 includes a summer 310, a loop filter 320, and a tracking loop element 330.

In FIG. 3, $\Phi_R(z)$ represents a signal proportional to the native (uncorrected) frequency and phase difference between the transmitter and the receiver. E(z) represents a signal proportional to the absolute phase difference between the received signal and phase-adjusted clock signal, (e.g., the z-transform of the adjusted error signal e(n)). L(z) represents the output of the loop filter (e.g., the z-transform of the filtered error signal l(n)). Y(z) represents the phase adjusted clock signal (e.g., the z-transform of the amplified/unamplified feedback signals).

The summer 310 represents the functions of the receiver circuit 105 and the error signal adjustment circuit 110. More particularly it represents a determination of the phase difference between that of the received signal r(n) (which has a phase and frequency of the transmitter clock) and that of the local signal s(n) (which has a phase and frequency of the adjusted receiver clock); an adjustment of the phase of the local signal s(n) based on the feedback from the agile clock 130; and a determination of the adjusted phase error e(n) after the feedback is provided.

The loop filter 320 represents the operation of the loop filter 120 of FIG. 1, and the loop filter transfer function F(z) represents the effect of the loop filter 120 on a signal passing through it. The parameters of the loop filter transfer function F(z) can be determined by the type of loop filter 120 used and the parameters of the elements within it. It can be determined by measurement, modeling, simulation, etc., as would be understood by one skilled in the art.

The tracking loop element 330 represents the portions of the tracking control loop circuit 100, not including the loop filter 320. This can include system delays 125, an agile clock 130, a DDS ROM, etc., (i.e., anything bandwidth limiting in the system). The tracking loop transfer function V(z) represents the effect of these elements on a signal passing through them, while the value of $K_L$ represents a gain factor. The parameters of the scaled tracking loop transfer function $K_L \cdot V(z)$ are determined by the various elements used in the tracking control loop 100 and the parameters of the elements within it. It can be determined by measurement, modeling, simulation, etc., as would be understood by one skilled in the art.

Figure 4:
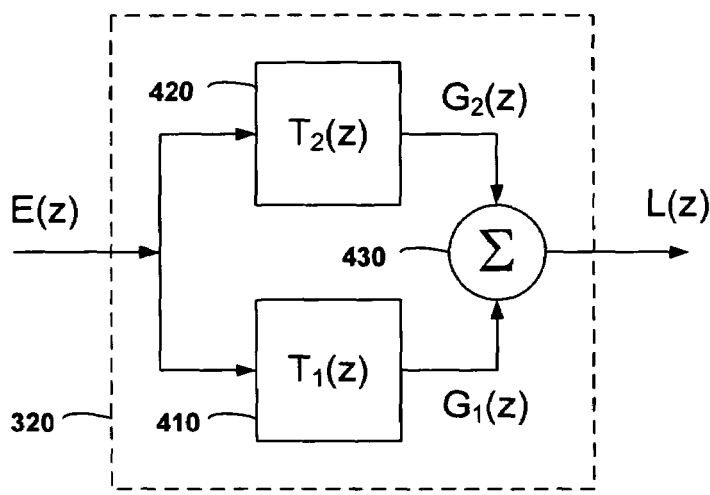
FIG. 4 is a diagram of the loop filter of FIG. 1, according to disclosed embodiments of the present invention.

FIG. 4 is a diagram of the loop filter 120 of FIG. I (i.e., the loop filter transfer function 320 of FIG. 3), according to a disclosed embodiment of the present invention. As shown in FIG. 4, the loop filter 320 includes a proportional path element 410, an integral path element 420, and a summer 430.

In FIG. 4, E(z) is the z-transform of the error signal received from the summer 310; $G_1(z)$ represents the output of the proportional path element 410 (e.g., the z-transform of the proportional path signal $g_1(n)$); $G_2(z)$ represents the output of the integral path element 420 (e.g., the z-transform of the integral path signal $g_2(n)$); and L(z) represents the output of the loop filter (e.g., the transfer function of the filtered error signal $l(n)$).

The proportional path element 410 represents the operation of the proportional path 210 of FIG. 3, and the proportional path transfer function $T_1(z)$ represents the effect of the proportional path 210 on a signal passing through it.

The integral path element 420 represents the operation of the integral path 220 of FIG. 3, and the integral path transfer function $T_2(z)$ represents the effect of the integral path 220 on a signal passing through it.

The summer 430 adds the proportional path signal $G_1(z)$ to the integral path signal $G_2(z)$ to produce the loop filter transfer function L(z).

Thus, the open loop transfer function for the tracking control loop 100 is shown in Equation (2):

$$\frac{Y(z)}{\Phi_R(z)} = K_L \cdot V(z) \cdot F(z) \tag{2}$$

As shown in FIG. 3, the value of the error signal E(z) can be shown as the difference between the phase and frequency difference signal $\Phi_R(z)$ and the phase adjusted clock signal Y(z):

$$E(z) = \Phi_R(z) - Y(z) \tag{3}$$

And the phase adjustment signal Y(z) is equal to the error signal E(z) multiplied by the loop transfer function F(z) and the scaled tracking loop transfer function $K_L \cdot V(Z)$ $$Y(z) = K_L \cdot V(z) \cdot F(z) \cdot E(z) \tag{4}$$

Combining Equations (3) and (4) shows that the error signal E(z) can be represented as:

$$E(z) = \Phi_R(z) - K_L \cdot V(z) \cdot F(z) \cdot E(z), \tag{5}$$

which gives:

$$\frac{E(z)}{\Phi_R(z)} = \frac{1}{1 + K_L \cdot V(z) \cdot F(z)} \tag{6}$$

For the sake of simplicity, the variable $K_L \cdot V(z) \cdot F(z)$ can be represented as a fractional number:

$$K_L \cdot V(z) \cdot F(z) = \frac{N(z)}{D(z)}, \tag{7}$$

with N(z) representing the numerator of the equation and D(z) representing the denominator of the equation. This allows Equation (6) to simplify into:

$$\frac{E(z)}{\Phi_R(z)} = \frac{D(z)}{N(z) + D(z)} \tag{8}$$

The transfer function for an unscaled tracking loop transfer function V(z) can be shown as:

$$V(z) = \frac{K_V \cdot z^{-1}}{1 - z^{-1}} \cdot \Delta(z), \tag{9}$$

where $K_V$ is the gain of the portion of the tracking control loop 100 that produces the corrected phase signal, and $\Delta(z)$ represents the various delays in the tracking control loop 100, and anything else that restricts the bandwidth of the tracking control loop 100.

Thus, a closed loop transfer function F(z) for the loop filter 120 can be shown as:

$$F(z) = \frac{(K_1 + K_2)\left(1 - \frac{K_1}{K_1 + K_2} \cdot z^{-1}\right)}{1 - z^{-1}} = \frac{L(z)}{E(z)} \tag{10}$$

Solving for L(z) gives us:

$$L(z) = \left(\frac{(K_1 + K_2)\left(1 - \frac{K_1}{K_1 + K_2} \cdot z^{-1}\right)}{1 - z^{-1}}\right) \cdot E(z) \tag{11}$$

Then, combining Equations (9) and (11) and multiplying both sides by $K_L$ gives:

$$K_L \cdot V(z) \cdot F(z) = \frac{K_L K_V (K_1 + K_2) \cdot z^{-1} \cdot \left(1 - \frac{K_1}{K_1 + K_2} \cdot z^{-1}\right) \cdot \Delta(z)}{(1 - z^{-1})^2} \tag{12}$$

And so, based on Equation (7), this means that:

$$N(z) = K_L K_V (K_1 + K_2) \cdot z^{-1} \cdot \left(1 - \frac{K_1}{K_1 + K_2} \cdot z^{-1}\right) \cdot \Delta(z), \text{ and} \tag{13}$$

$$D(z) = (1 - z^{-1})^2 \tag{14}$$

Now, looking at FIG. 4, the output of the loop filter 120 can be written as:

$$L(z) = G_1(z) + G_2(z), \tag{15}$$

Solving Equation (15) for $G_2(z)$ gives:

$$G_2(z) = L(z) - G_1(z) \tag{16}$$

Looking at FIG. 3, the output of the proportional path 210 can be written as:

$$G_1(z) = K_1 \cdot E(z) \tag{17}$$

Combining Equations (8), (11), (16), and (17), and solving for $$\frac{G_2(z)}{\Phi_R(z)}$$

gives the following equation:

$$\frac{G_2(z)}{\Phi_R(z)} = \frac{K_2(1 - z^{-1})}{N(z) + D(z)} \tag{18}$$

If the transfer function $P(z)$ is defined as:

$$P(z) = \frac{1}{N(z) + D(z)}, \tag{19}$$

then Equation (18) simplifies to:

$$\frac{G_2(z)}{\Phi_R(z)} = K_2 \cdot (1 - z^{-1}) \cdot P(z) \tag{20}$$

Moving to the time (or sample) domain by inverse transform gives the following equation for $g_2(n)$, i.e., the output of the integral path 220 of the loop filter 120:

$$g_2(n) = K_2(\phi_R(n) - \phi_R(n-1)) * p(n), \tag{21}$$

where $\phi_R(n)$ is the signal described above that is proportional to the uncorrected phase and frequency difference between the transmitter and the receiver for any given sample n, and p(n) is the inverse transform function of P(z).

The phase of the received signal $\phi_R(n)$ can be shown as a signal that is proportional to the phase of the transmitter $\phi_T(n)$, modified by a noise term:

$$\phi_R(n) + \alpha \cdot \phi_T(n) + \sigma \cdot \eta(n) \tag{22}$$

where $\alpha$ is a proportional scaling factor, $\sigma$ is a noise constant, and $\eta(n)$ is a random noise term that is normally distributed (IID) with a variance of 1, i.e.,:

$$\eta(n) \approx N(0,1) \tag{23}$$

Combining Equations (21) and (22) shows that $$\phi_R(n) - \phi_R(n-1) = \alpha \cdot \Delta\phi + \sigma \cdot m(n), \tag{24}$$

where a new noise term m(n) is used as follows:

$$m(n) = \eta(n) - \eta(n-1). \tag{25}$$

This allows the signal $g_2(n)$ to be represented more simply as:

$$g_2(n) = K_2(\alpha \cdot \phi + \sigma \cdot m(n)) * p(n) \tag{26}$$

Now for some sample value V, the function p(n) can be considered to approximate a finite input response (FIR) filter, meaning that p(n) is non-zero for the duration from (n=0) to (n=V), but is effectively zero elsewhere, i.e., for n<0 and n>V, $p(n) \approx 0$. This allows us to represent W samples of $g_2(n)$, with $W \geq V$, as:

$$\overline{g}_2 = K_2 \cdot P'(\alpha \cdot \Delta\phi \cdot \overline{1} + \sigma \cdot \overline{m}), \tag{27}$$

where P' represents a convolutional matrix for p(n). An example of P' for W=V is shown in Equation (28):

$$P' = \begin{bmatrix} p(0) & 0 & 0 & \cdots & 0 \\ p(1) & p(0) & 0 & \cdots & 0 \\ p(2) & p(1) & p(0) & \cdots & 0 \\ \cdots & \cdots & \cdots & \cdots & \cdots \\ p(V) & p(V-1) & p(V-2) & \cdots & p(0) \end{bmatrix} \tag{28}$$

We know that the expected value of the random noise term $\eta(n)$ is zero (since it is IID), which means that the expected value of the new noise term m(n) is also zero, as shown in Equation (33):

$$E\{m(n)\} = E\{\eta(n)\} - E\{\eta(n-1)\} = 0 - 0 = 0 \tag{29}$$

We further know that the expected value of $\overline{m} \cdot \overline{m}^T$ can be shown as:

$$E\{\overline{m} \cdot \overline{m}^T\} = C = \begin{bmatrix} 2 & -1 & 0 & \cdots & 0 & 0 \\ -1 & 2 & -1 & \cdots & 0 & 0 \\ 0 & -1 & 2 & \cdots & 0 & 0 \\ \cdots & \cdots & \cdots & \cdots & \cdots & \cdots \\ 0 & 0 & 0 & \cdots & 2 & -1 \\ 0 & 0 & 0 & \cdots & -1 & 2 \end{bmatrix}, \tag{30}$$

which for the sake of simplicity can be referred to as C, the noise covariance matrix of $\overline{m}$.

If we further define the following matrices:

$$P' \cdot \overline{1} = \overline{a}, \text{ and} \tag{31}$$

$$P' \cdot \overline{m} = \overline{s}, \tag{32}$$

then Equation (27) simplifies to:

$$\overline{g}_2 = \alpha K_2 \cdot \overline{a} \cdot \Delta\phi + \sigma \cdot K_2 \cdot \overline{s} \tag{33}$$

Estimation of Phase Error

Equation (33) shows a linear system of equations with one unknown, i.e., the ramping phase error $\Delta\phi$ between the received signal and the starting frequency of the local clock, and a vector of observations $\overline{g}_2$ of the integral path 220 in the loop filter 120. It is therefore possible to determine a value for the phase error $\Delta\phi$ based on the observed output signal $\overline{g}_2$. And since the frequency difference between the transmitter and the receiver is directly related to the ramping phase error $\Delta\phi$, this value can be used to determine the frequency difference.

Figure 5:
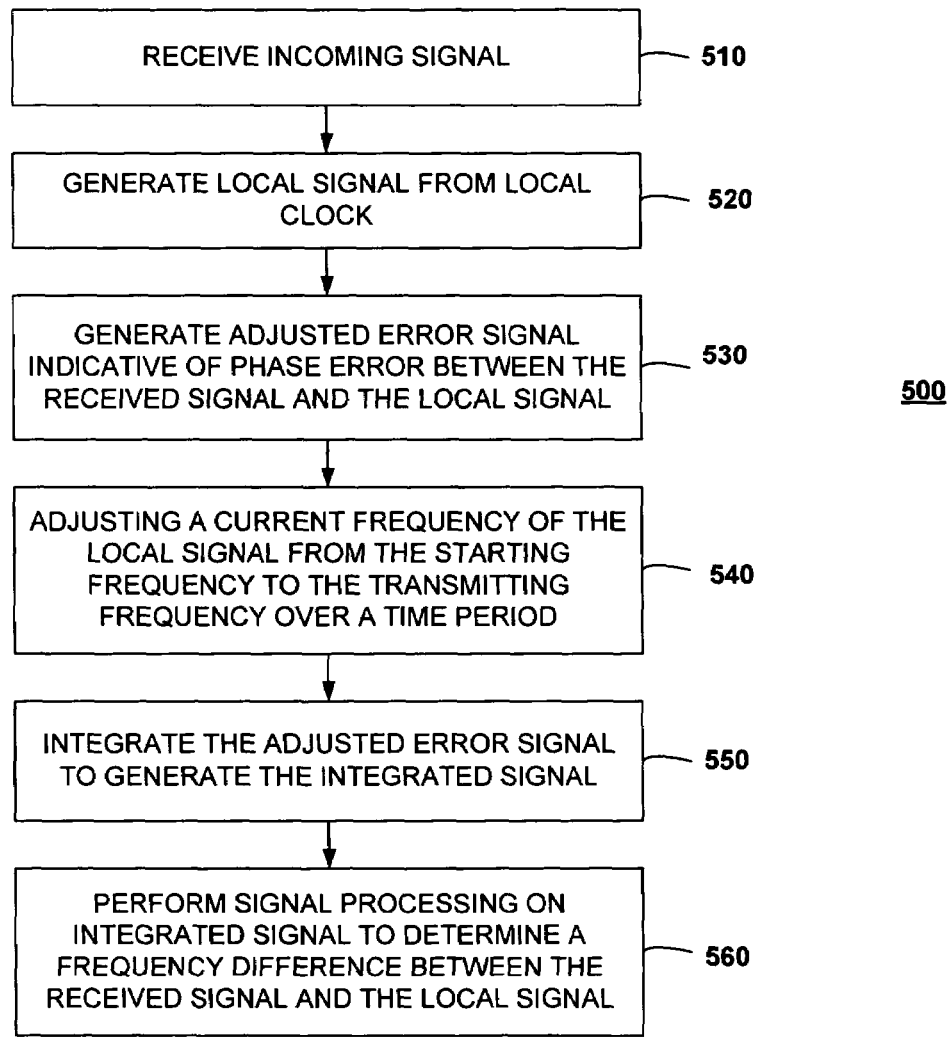
FIG. 5 is a flow chart showing the estimation of the phase error according to disclosed embodiments of the present invention.

FIG. 5 is a flow chart showing the estimation of the phase error according to disclosed embodiments of the present invention. As shown in FIG. 5, the estimation process 400 begins when the local device receives an incoming signal. (510) and generates a local signal based on a local clock. (520)

The device then compares the local signal and the received signal to determine an adjusted base error signal that is indicative of the phase difference between the local signal and the received signal. (530) As shown in FIG. 1, one way to generate an adjusted error signal is to first generate an on-time signal and an unadjusted error signal, to then determine the sign of the on-time signal, and finally multiply the unadjusted error signal by the sign of the on-time signal. However, alternate implementations are possible as would be understood by one skilled in the art.

Over time, the device adjusts a current frequency of the local signal (i.e. an agile clock frequency) from the starting frequency to the transmitting frequency. (540) This can be done by the operation of the tracking control loop 100.

Once the frequency of the local signal is stable (i.e., the tracking control loop 100 has reached a point at which its agile clock's frequency is no longer substantially changing), the local device then integrates the adjusted error signal to generate an integrated error signal. (550) As shown in FIGS. 1 and 2, this can be accomplished by passing the adjusted error signal through a loop filter 120 and in a portion of that loop filter 120 amplifying and integrating the adjusted error signal to generate an integrated signal. However, alternate loop filter designs and other elements within the tracking control loop 100 that integrate the adjusted error signal could be used in alternate embodiments.

The local device then performs signal processing on the integrated signal to determine a frequency difference between the received signal and the local signal (i.e., the frequency difference between a clock in the transmitting device and a clock in the local device). (560) Any appropriate signal processing can be used to estimate the values from Equation (33). Exemplary signal processing techniques include: weighted least squares, least squares, averaging, leaky integration, or the like.

The local device can then use this frequency estimate to preset a frequency offset in its local clock when it receives more signals from the transmitting device. This will improve system performance and allow for a less accurate clock crystals.

General Method of Estimation

A general way to process an integrated signal to estimate the frequency difference (i.e., frequency error) between the received signal and the local clock is to pass the integrated signal through a filter that calculates some kind of weighted sum, and then multiply that weighted sum by a scaling factor to account for circuit parameters.

Taking Equation (33), general equation for an estimation of the ramping phase difference $\Delta\hat{\phi}$ between the transmitter clock and the receiver clock:

$$\Delta\hat{\phi}_G = \frac{1}{\alpha \cdot K_2} \cdot \left(\frac{1}{\bar{x}^T \cdot \bar{a}}\right) \cdot \bar{x}^T \cdot \bar{g}_2 \qquad (34)$$

where $\bar{x}^T$ is an array that provides a weighting sum when multiplied by the array of integrated signal samples $\bar{g}_2$, and $\bar{x}^T \cdot \bar{g}_2$ is the resulting weighted sum of the observation.

If the values M and β defined as:

$$M = \frac{1}{\alpha \cdot K_2}, \text{ and} \qquad (35)$$

$$\beta = \bar{x}^T \cdot \bar{a}, \qquad (36)$$

then Equation (34) can be simplified as:

$$\Delta\hat{\phi}_G = \frac{M}{\beta} \cdot \bar{x}^T \cdot \bar{g}_2 \qquad (37)$$

In other words, if the sample size is W, $$\bar{g}_2 = \begin{bmatrix} g_2(0) \\ g_2(1) \\ \cdots \\ g_2(W) \end{bmatrix}, \qquad (38)$$

$$\bar{x}^T = [x(0) \quad x(1) \quad \cdots \quad x(W)], \qquad (39)$$

meaning that $\bar{x}^T \cdot \bar{g}_2$ is just the sum of the products of corresponding values of x(n) and $g_2$(n), and $\Delta\hat{\phi}_G$ is just that sum weighted by the value $$\frac{M}{\beta}.$$

Combining Equations (24), (35), (36), and (37) shows that:

$$\Delta\hat{\phi}_G = \Delta\phi + \frac{\sigma}{\alpha \cdot \beta} \cdot (\bar{x}^T \cdot \bar{s}). \qquad (40)$$

This means that the expected value of $\Delta\hat{\phi}_G$ is:

$$E\{\Delta\hat{\phi}_G\} = E\{\Delta\phi\} + E\left\{\frac{\sigma}{\alpha \cdot \beta} \cdot (\bar{x}^T \cdot \bar{s})\right\} \qquad (41)$$

And so, using Equations (29) and (41), it is possible to show that:

$$E\{\Delta\hat{\phi}_G\} = E\{\Delta\phi\} + 0 = \Delta\phi \qquad (42)$$

Thus, a general filtered estimate of the ramping phase $\Delta\hat{\phi}_G$, as determined by Equation (40), provides an unbiased estimate for the actual ramping phase $\Delta\phi$.

Figure 6:
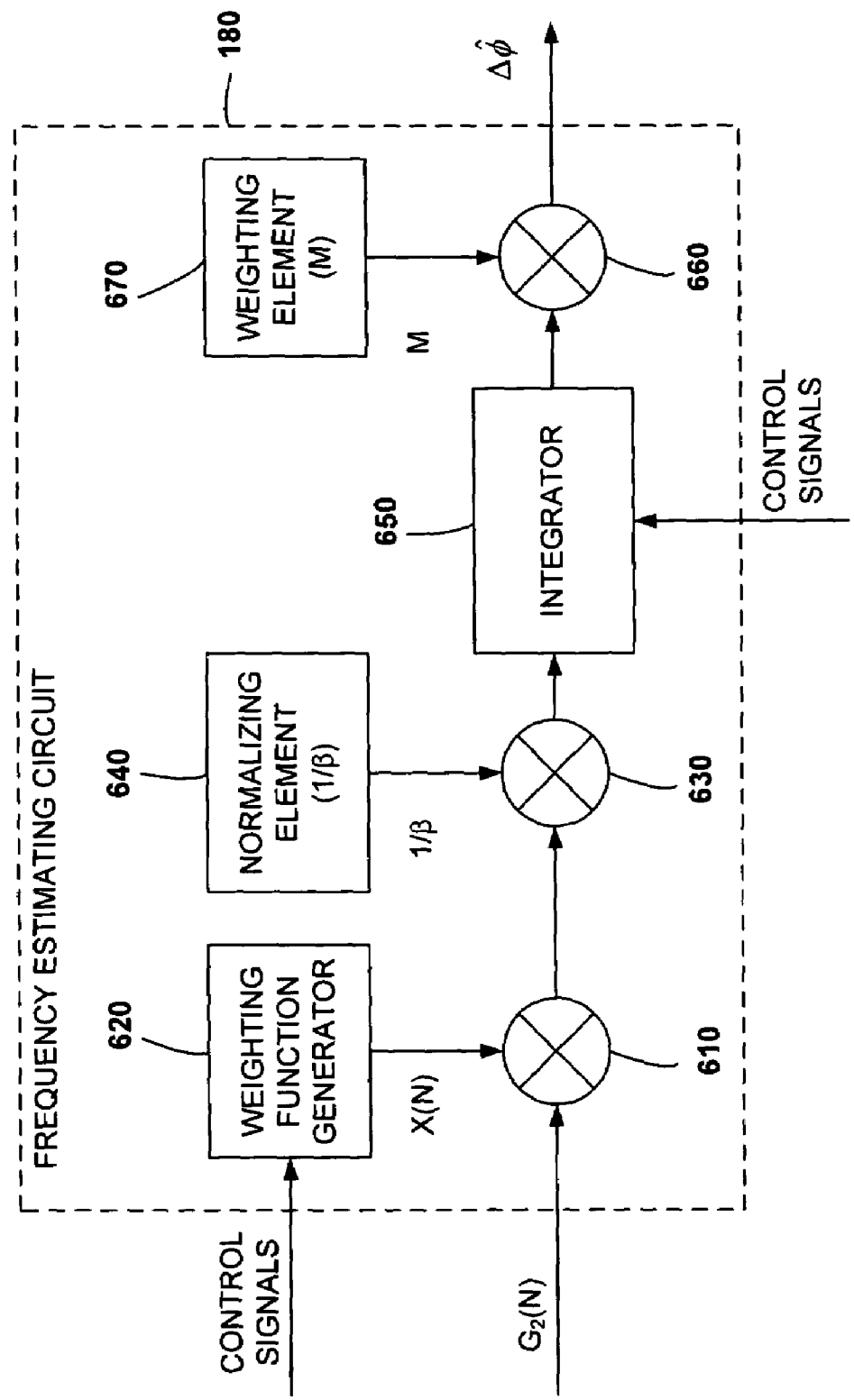
FIG. 6 is a block diagram of the functionality of a frequency estimating circuit of FIG. 1, according to a disclosed embodiment of the present invention.

FIG. 6 is a general block diagram of the functioning of a frequency estimating circuit of FIG. 1, according to a disclosed embodiment of the present invention, which embodiment can be used to calculate a ramping phase estimate $\Delta\hat{\phi}_G$. As shown in FIG. 6, this estimate can be achieved by having the frequency estimating circuit 180 include a first mixer 610, a weighting function generator 620, a second mixer 630, a normalizing element 640, an integrator 650, a third mixer 660, and a weighting element 670.

The first mixer 610 mixes samples of the integral path signal $g_2$(n) from the loop filter 120 with a weighting function x(n) to create a series of weighted signals.

The weighting function generator 620 generates the proper signals for the weighting function x(n) in response to control signals (e.g., timing signals). The weighting function generator 620 could be a memory device that stores the proper weighting values, or a circuit that generates them at need. The weighting values, or the function for generating the weighting values, are determined by the kind of weighted sum that is desired (e.g., weighted least squares, least squares, averaging, leaky integrator, etc.).

They are derived either by measurement or modeling of the receiver system in a manner that would be understood to one skilled in the art based on Equation (40). These weighting values would only have to be determined once for any given receiver and estimator design, since they will not change.

The integrator 650 integrates the values of the normalized weighted sum from the second mixer 640 from the first sample until the $W^{th}$ sample. In one embodiment the integrator 650 can be a simple accumulator with a summer and a delay, though alternate integrator implementations could also be used.

Although FIG. 6 shows the functioning of the frequency estimating circuit 180 in a mathematical sense, the frequency estimating circuit 180 could actually be implemented by a filter that performs the functions shown in FIG. 6, or at least approximates those functions.

Exemplary embodiments will be given below. In each of these embodiments, a different sort of filter, or weighted sum, will be provided. In other words, the weighting function x(n) (and thus the weighting sum array $\bar{x}^T$), along with the normalizing factor β will be specifically defined, and an appropriate filter will be chosen that emulates the circuit of FIG. 6 for this weighting function and normalizing factor.

Weighted Least Squares Estimation

One way to process an integrated signal to estimate the frequency difference between the received signal and the local clock is to use a weighted least squares estimate. This method provides a maximum likelihood estimate of the frequency difference. A weighted least squares estimate can be implemented using a finite impulse response (FIR) filter. However, the solution can be approximated by an infinite impulse response (IIR) filter that requires fewer taps.

For a weighted least squares estimate, the noise covariance matrix Γ of $P' \cdot \bar{m}$ of Equation (27) is defined as:

$$\Gamma = P' \cdot C \cdot P'^T, \quad (43)$$

and the element $\bar{x}^T$ is defined as:

$$\bar{x}^T = \bar{a}^T \cdot \Gamma^{-1}, \quad (44)$$

with the general term β being replaced by ω, for the particular value of $\bar{x}^T$ shown in Equation (36), i.e.:

$$\omega = (\bar{a}^T \cdot \Gamma^{-1}) \cdot \bar{a}. \quad (45)$$

In an embodiment in which (W>N), and so Γ is singular, the pseudo-inverse of Γ could be used in Equation (45) rather than the simple inverse.

The values used to replace $\bar{x}^T$ and β define a weighted least squares operation, and can be used to define the parameters of an FIR filter. These variables can also be used in Equation (40) to mathematically determine the weighted least squares estimate for the ramping phase $\Delta\hat{\phi}_{WLS}$ as:

$$\Delta\hat{\phi}_{WLS} = \frac{M}{\omega} \cdot \bar{a}^T \cdot \Gamma^{-1} \cdot \bar{g}_2. \quad (46)$$

Equation (46) can then be used to determine the value of the weighted least squares estimate of the ramping phase $\Delta\hat{\phi}_{WLS}$, which can in turn be used to calculate the frequency difference between the received signal and the local clock. The term $\bar{g}_2$ is a measured value, and all of the other terms in this equation can be determined through measurement, modeling, or simulation of the tracking control loop 100.

Since Equation (46) is the same as Equation (40), except with the variables further defined, the weighted least squares estimate of the ramping phase $\Delta\hat{\phi}_{WLS}$ will provide an unbiased estimate for the actual ramping phase $\Delta\phi$, as shown in Equation (42).

The weighted least squares embodiment of the frequency estimating circuit 180 provides for a maximum-likelihood estimate that allows a desired variance of the weighted least squares ramping phase estimate $\Delta\hat{\phi}_{WLS}$ to be achieved with the lowest sample length W (i.e., the lowest length of the array $\bar{x}^T$). In other words, for a given sample length W, the weighted least squares ramping phase estimate $\Delta\hat{\phi}_{WLS}$ will have the lowest possible variance.

Least Squares Estimation

Another way to use the output signal $g_2(n)$ of the integral path 220 in the loop filter 120 to estimate the phase error $\Delta\phi$ between the received signal and the local clock is to use a least squares estimate. A least squares estimate can be implemented using a FIR filter. However, the solution can be approximated by an infinite impulse response (IIR) filter that requires fewer taps.

If the element $\bar{x}^T$ is defined as:

$$\bar{x}^T = \bar{a}^T, \quad (47)$$

with the general term β being replaced by ρ, for the particular value of $\bar{x}^T$ shown in Equation (36), i.e.:

$$\rho = \bar{a}^T \cdot \bar{a}. \quad (48)$$

The values used to replace $\bar{x}^T$ and β define a least squares operation, and can be used to define the parameters of an FIR filter. These variables can also be used in Equation (40) to mathematically determine the least squares estimate for the ramping phase $\Delta\hat{\phi}_{LS}$ as:

$$\Delta\hat{\phi}_{LS} = \frac{M}{\rho} \cdot \bar{a}^T \cdot \bar{g}_2. \quad (49)$$

The least squares estimate of the ramping phase $\Delta\hat{\phi}_{LS}$ can in turn be used to calculate the frequency difference between the received signal and the local clock. The term $\bar{g}_2$ is a measured value, and all of the other terms in this equation can be determined through measurement, modeling, or simulation of the tracking control loop 100.

Since Equation (49) is the same as Equation (40), except with the variables further defined, the least squares estimate of the ramping phase $\Delta\hat{\phi}_{LS}$ will provide an unbiased estimate for the actual ramping phase $\Delta\phi$, as shown with through Equation (42).

As compared with the weighted least squares embodiment of the frequency estimating circuit 180, the least squares embodiment allows a desired variance of the ramping phase estimate to be achieved with a higher sample length W. This is because the noise term in Equation (49) has a higher variance than the noise term in Equation (46). However, the process of determining the weighting function is considerably simplified.

Averaging Estimation

Another way to use the output signal $g_2(n)$ of the integral path 220 in the loop filter 120 to estimate the phase error $\Delta\phi$ between the received signal and the local clock is to use an averaging estimate. An averaging estimate can be implemented using an averaging filter.

If element $\bar{x}^T$ is defined as:

$$\bar{x} = \bar{1}^T, \quad (50)$$

with the general term β being replaced by ψ for the particular value of $\bar{x}^T$ shown in Equation (36), i.e.:

$$\psi = \bar{1}^T \cdot \bar{a}. \quad (51)$$

The values used to replace $\bar{x}^T$ and β define an averaging operation, and can be used to define the parameters of an averaging filter. These variables can also be used in Equation (40) to mathematically determine an averaging estimate for the ramping phase $\Delta\hat{\phi}_A$ as being:

$$\Delta\hat{\phi}_A = \frac{M}{\psi} \cdot \bar{1}^T \cdot \bar{g}_2. \quad (52)$$

The averaging estimate of the ramping phase $\Delta\hat{\phi}_A$ can in turn be used to calculate the frequency difference between the received signal and the local clock. The term $g_2$ is a measured value, and all of the other terms in this equation can be determined through measurement, modeling, or simulation of the tracking control loop 100.

Since Equation (52) is the same as Equation (40), except with the variables further defined, the weighted least squares estimate of the ramping phase $\Delta\hat{\phi}_A$ will provide an unbiased estimate for the actual ramping phase Δφ, as shown with through Equation (42).

An averaging estimate is relatively easy to implement, since the normalizing value ψ is just the sum of all of the elements in the array $\bar{a}$, and the weighting function x(n) involves multiplying the input term $g_2(n)$ by 1 (i.e., doing nothing to it). However, it has a higher variance than either a weighted least squares approach or a least squares approach, so it requires a larger samples size W to achieve a desired level of accuracy. It also may require the frequency estimating circuit 180 to maintain a large running sum in its accumulator 550 as W increases in size.

Leaky Integrator Estimation

Another way to use the output signal $g_2(n)$ of the integral path 220 in the loop filter 120 to estimate the phase error Δφ between the received signal and the local clock is to use a leaky integration estimate. A leaky integration estimate can be implemented using a leaky integrator filter.

If element $\bar{x}^T$ is defined as:

$$\bar{x}^T = \bar{h}^T, \quad (53)$$

with the general term β being replaced by λ for the particular value of $\bar{x}^T$ shown in Equation (36), i.e.:

$$\lambda = \bar{h}^T \cdot \bar{a} \quad (54)$$

The values used to replace $\bar{x}^T$ and β define a leaky integration operation, and can be used to define the parameters of a leaky integrator filter. These variables can also be used in Equation (40) to mathematically determine a leaky integration estimate for the ramping phase $\Delta\hat{\phi}_{LI}$ as being:

$$\Delta\hat{\phi}_{LI} = \frac{M}{\lambda} \cdot \bar{h}^T \cdot \bar{g}_2. \quad (55)$$

The function h(n), which defines the array $\bar{h}$, is the function associated with a leaky integrator filter. An output t(n) of the leaky integrator filter can be defined as:

$$t(n) = \mu \cdot g_2(n) + (1-\mu) \cdot t(n-1), \quad (56)$$

Where μ is a scaling factor such that 0<μ<1, and $g_2(n)$ is the input signal to the leaky integrator.

The transfer function of the leaky integration function h(n) is therefore:

$$H(z) = \frac{T(z)}{G_2(z)} = \frac{\mu}{1 - (1-\mu)z^{-1}} \quad (57)$$

This means that the function h(n) can be determined by:

$$h(n) = \mu \cdot (1-\mu)^n \cdot U(n) \quad (58)$$

where U(n) is unit step function.

The value of t(n) at the end of W samples can therefore be used in place of the value $\bar{h}^T \cdot \bar{g}_2$ in Equation (55) such that:

$$\Delta\hat{\phi}_{LI} = \frac{M}{\lambda} \cdot t(W) \quad (59)$$

The leaky integration estimate of the ramping phase $\Delta\hat{\phi}_{LI}$ can in turn be used to calculate the frequency difference between the received signal and the local clock. The term $\bar{g}_2$ is a measured value, and all of the other terms in this equation can be determined through measurement, modeling, or simulation of the tracking control loop 100.

Since Equation (55) is the same as Equation (40), except with the variables further defined, the weighted least squares estimate of the ramping phase $\Delta\hat{\phi}_{LI}$ will provide an unbiased estimate for the actual ramping phase Δφ, as shown with through Equation (42).

The output of a leaky integrator filter has a higher variance than the filters used for a weighted least squares estimate, a least squares estimate, or an averaging estimate, thus requiring a larger value of W. However, it is relatively cheap and easy to implement.

Use of a Stored Frequency Offset

Figure 7:
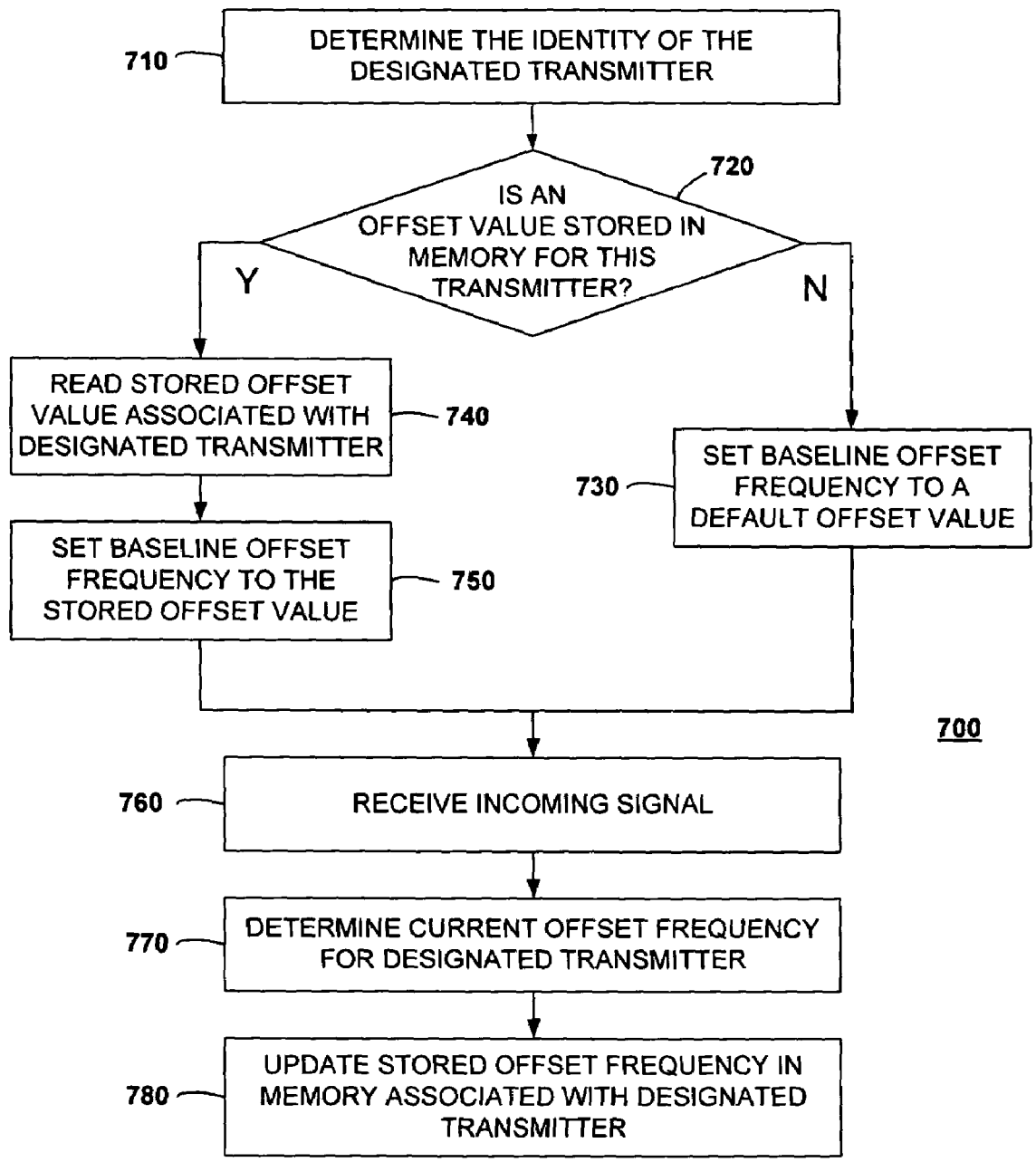
FIG. 7 is a flow chart showing the use of a stored offset frequency to facilitate the processing of an incoming signal.

The ramping phase estimate $\Delta\hat{\phi}$, however it is determined, can be used by a local agile clock to improve data reception for future data streams from the same device. FIG. 7 is a flow chart showing the use of a stored offset frequency to facilitate the processing of an incoming signal.

As shown in FIG. 7, upon being allocated a channel time for receiving a signal, a receiving device will determine the identity of the designated transmitter. (710) This can be done in some embodiments by reading this information from channel time allocation data provided by a network coordinator.

The receiving device then determines whether it has a frequency offset value stored in a memory device associated with the designated transmitter. (720) By way of example, this frequency offset value could be one previously determined after reception of an earlier signal from the designated transmitter, or could have been received from another device.

For example, suppose a first device synchronizes to a second device and determines a first frequency offset between the first device and the second device. At a different time the first device synchronizes to a third device and determines a second frequency offset between the first device and the third device. The first device can then determine a pair of third frequency offsets between the second device and the third device based on the first and second frequency offsets. These offsets will be the same in magnitude but opposite in sign for the second and third devices. The first device could then send respective third frequency offsets to the second and third devices to use as stored frequency offsets.

If the receiving device determines that there is no offset value stored for the designated transmitter (720), the receiving device sets a baseline offset frequency in its agile clock to a default offset value. In some embodiments this can be accomplished simply by creating a new entry in a database for the designated transmitter, using the default offset value as a stored offset value. (730) The default offset value can be zero or any other desirable value.

If the receiving device determines that there is an offset value stored for the designated transmitter (720), the receiving device reads the stored offset value associated with the designated transmitter (740) and sets a baseline offset frequency in its agile clock to a default offset value. (750)

In alternate embodiments, a baseline offset frequency can be stored in memory for all devices. In this embodiment no actual determination need be made regarding whether an offset value is stored for the designated transmitter.

Once the receiving device's agile clock has its baseline offset frequency set, the receiver can receive a signal from the designated transmitter. (760) The receiving device generates a local signal based on the agile clock signal to demodulate the incoming signal, the tracking control loop in the receiver ultimately drives the frequency of the agile clock to the frequency of the received signal.

Once a sufficient period of time has elapsed for the tracking loop to have converged the agile clock's frequency to that of the received signal, the receiving device can determine a new offset frequency that indicates a difference between the baseline offset frequency for the current data stream and the frequency of the received signal. (770) This determination can be performed as described above with respect to FIGS. 1 to 6.

The receiving device then uses this new offset frequency to determine a revised offset frequency for the designated transmitter and update the stored offset frequency based on this new offset frequency. (780) If this is the first time a signal has been received by the receiving device, this determination of a new offset frequency can be performed simply by storing the new frequency estimate in memory. If a previous offset frequency has been stored, it can be updated based on the current frequency estimate (e.g., by adding the stored offset frequency and the current frequency estimate).

Conclusion

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method for estimating a frequency difference between a transmitter clock in a transmitting device and a receiver clock in a receiving device, comprising:

receiving a signal from the transmitting device at the receiving device, the received signal having a transmitter frequency;

generating a local signal at the receiving device, the local signal having a starting frequency;

comparing a received signal phase and a local signal phase to determine an adjusted error signal representing a phase difference between the received signal and the local signal;

adjusting a current frequency of the local signal from the starting frequency to the transmitting frequency over a time period;

filtering the adjusted error signal using a non-integrating filter to generate a proportional path signal;

integrating the adjusted error signal over the time period to generate an integrated error signal;

summing the proportional path signal and the integrated error signal to generate a filtered error signal, filtering the integrated error signal to generate a frequency difference estimate indicative of the frequency difference between the transmitter frequency and the starting frequency;

storing a frequency offset value in a memory element, the frequency offset value being updated based on the frequency difference estimate; and generating an agile clock signal based on a receiver clock signal, the frequency offset value, and the filtered error signal, wherein the local signal is generated in response to the agile clock signal.

2. A method for estimating a frequency difference, as recited in claim 1, wherein the integrated error signal is determined at an intermediate port in a proportional-integral filter.

3. A method for estimating a frequency difference, as recited in claim 1, wherein the filtering of the integrated error signal further comprises one of: performing a leaky integration operation on the integrated error signal, performing an averaging operation on the integrated error signal, performing a least squares operation on the integrated error signal, and performing a weighted least squares operation on the integrated error signal.

4. A method for estimating a frequency difference, as recited in claim 1, wherein the method is performed in an ultrawide bandwidth receiver.

5. A method for estimating a frequency difference, as recited in claim 1, wherein the method is implemented in an integrated circuit.

6. A circuit for determining a frequency offset, comprising:

a local signal generator configured to generate a local signal having a variable frequency, the variable frequency varying from a starting frequency to a transmitter frequency;

a phase detector configured to receive a signal from the transmitting device, and receive the local signal, and generate an adjusted error signal representing a phase difference between the received signal and the local signal, the received signal from the transmitting device having the transmitter frequency;

a tracking loop filter configured to integrate the adjusted error signal to generate an integrated error signal, filter the adjusted error signal using a non-integrating filtering element to generate a proportional path signal, and to provide a filtered error signal, by summing the integrated error signal and the proportional path signal;

a frequency-estimating circuit configured to filter the integrated error signal to generate a frequency difference estimate indicative of the frequency difference between the transmitter frequency and the starting frequency; and a memory element for storing a frequency offset value, the frequency offset value being updated based on the frequency difference estimate; and an agile clock, separate from the local signal generator, for generating an agile clock signal based on a receiver clock signal, the frequency offset value, and the filtered error signal, wherein the local signal is generated in response to the agile clock signal.

7. A circuit for determining a frequency offset, as recited in claim 6, wherein the frequency estimating circuit farther comprises one of: an infinite-impulse response filter and a finite-impulse response filter.

8. A circuit for determining a frequency offset, as recited in claim 6, wherein the frequency estimating circuit farther comprises one of a leaky integrator filter, an averaging filter, a least squares filter, and a weighted least squares filter.

9. A circuit for determining a frequency offset, as recited in claim 6, wherein the circuit is part of an ultrawide bandwidth receiver.

10. A method for estimating a frequency difference, as recited in claim 1, wherein the frequency offset value is generated based, at least in part, on the frequency difference estimate.

11. A circuit for determining a frequency offset, as recited in claim 6, wherein the frequency offset value is generated based, at least in part, on the frequency difference estimate.

* * * * *